US012509772B2

(12) United States Patent
Borth et al.

(10) Patent No.: US 12,509,772 B2
(45) Date of Patent: Dec. 30, 2025

(54) SPLIT SHOWERHEAD COOLING PLATE

(71) Applicant: LAM RESEARCH CORPORATION, Fremont, CA (US)

(72) Inventors: Andrew Borth, Newberg, OR (US); Sean M. Donnelly, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 601 days.

(21) Appl. No.: 18/008,325

(22) PCT Filed: Apr. 30, 2021

(86) PCT No.: PCT/US2021/030039
§ 371 (c)(1),
(2) Date: Dec. 5, 2022

(87) PCT Pub. No.: WO2021/252096
PCT Pub. Date: Dec. 16, 2021

(65) Prior Publication Data

US 2023/0203658 A1 Jun. 29, 2023

Related U.S. Application Data

(60) Provisional application No. 63/037,176, filed on Jun. 10, 2020.

(51) Int. Cl.
*C23C 16/455* (2006.01)
*H01J 37/32* (2006.01)

(52) U.S. Cl.
CPC .. *C23C 16/45572* (2013.01); *C23C 16/45565* (2013.01); *C23C 16/4557* (2013.01); *H01J 37/3244* (2013.01)

(58) Field of Classification Search
CPC ........ C23C 16/45572; C23C 16/45565; C23C 16/4557; H01J 37/3244; H01J 37/32522
See application file for complete search history.

(56) References Cited

U.S. PATENT DOCUMENTS 6,079,356 A 6/2000 Umotoy et al.
8,282,770 B2 10/2012 Handa
8,480,849 B2 7/2013 Handa
(Continued)

FOREIGN PATENT DOCUMENTS

CN 101824606 A 9/2010
CN 102230165 A 11/2011
(Continued)

OTHER PUBLICATIONS

International Search Report and Written Opinion of the ISA issued in PCT/US2021/030039, mailed Aug. 27, 2021; ISA/KR.
(Continued)

*Primary Examiner* — Jeffrie R Lund

(57) ABSTRACT

A cooling assembly includes a first subassembly and a second subassembly. The first subassembly is coupled to a showerhead of a substrate processing system. The first subassembly including a plurality of passages proximate to and in thermal communication with the showerhead. The second subassembly is removably coupled to the first subassembly. The second subassembly includes a plurality of protrusions that align with the plurality of passages, respectively.

20 Claims, 7 Drawing Sheets

(56) References Cited

U.S. PATENT DOCUMENTS

| | | | | |
|---|---|---|---|---|
| 8,758,551 | B2 | 6/2014 | Handa | |
| 10,714,315 | B2 * | 7/2020 | White | H01J 37/32449 |
| 2006/0042754 | A1 | 3/2006 | Yoshida et al. | |
| 2007/0215580 | A1 | 9/2007 | Koshishi et al. | |
| 2014/0103145 | A1 | 4/2014 | White et al. | |
| 2018/0142352 | A1 * | 5/2018 | Shah | C23C 16/45572 |
| 2019/0066985 | A1 * | 2/2019 | Hirose | H01L 21/6831 |
| 2022/0243331 | A1 * | 8/2022 | Savandaiah | C23C 16/4585 |
| 2022/0282377 | A1 * | 9/2022 | Luo | C23C 16/45565 |
| 2023/0203658 | A1 * | 6/2023 | Borth | H01J 37/32522 118/724 |
| 2024/0417854 | A1 * | 12/2024 | Gomm | C23C 16/505 |

FOREIGN PATENT DOCUMENTS

| | | | | |
|---|---|---|---|---|
| CN | 106558517 | A | 4/2017 | |
| JP | 2002503765 | A | 2/2002 | |
| JP | 2006066855 | A | 3/2006 | |
| JP | 2007227789 | A | 9/2007 | |
| JP | 2008001923 | A | 1/2008 | |
| JP | 2008227064 | A | 9/2008 | |
| TW | 201334062 | A | 8/2013 | |
| TW | 201421575 | A | 6/2014 | |
| TW | 201944522 | A | 11/2019 | |
| WO | WO-2019241018 | A1 | 12/2019 | |
| WO | WO-2021042116 | A1 * | 3/2021 | C23C 16/45565 |

OTHER PUBLICATIONS

Japanese Office Action for Japanese Application No. 2022-575894 dated Dec. 3, 2024.

Taiwanese Office Action and Search Report for Taiwanese Application No. 110120540 issued Feb. 27, 2025.

* cited by examiner

SPLIT SHOWERHEAD COOLING PLATE

CROSS-REFERENCE TO RELATED APPLICATIONS

This application is a U.S. National Phase Application under 35 U.S.C. 371 of International Application No. PCT/US2021/030039, filed on Apr. 30, 2021, which claims the benefit of U.S. Provisional Application No. 63/037,176, filed on Jun. 10, 2020. The entire disclosures of the applications referenced above are incorporated herein by reference.

FIELD

The present disclosure relates generally to substrate processing systems and more particularly to a split cooling plate for cooling showerheads in the substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD), a chemically enhanced plasma vapor deposition (CEPVD), a sputtering physical vapor deposition (PVD), atomic layer deposition (ALD), and plasma enhanced ALD (PEALD). Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. A computer-controlled robot typically transfers substrates from one processing chamber to another in a sequence in which the substrates are to be processed. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. The processing chambers are periodically cleaned by supplying a cleaning gas into the processing chamber and striking plasma.

SUMMARY

A cooling assembly comprises a first subassembly and a second subassembly. The first subassembly is coupled to a showerhead of a substrate processing system. The first subassembly including a plurality of passages proximate to and in thermal communication with the showerhead. The second subassembly is removably coupled to the first subassembly. The second subassembly includes a plurality of protrusions that align with the plurality of passages, respectively.

In other features, the first subassembly is hollow and cylindrical in shape having an inner diameter. The second subassembly is solid and cylindrical in shape having an outer diameter that is less than the inner diameter. The second subassembly is inserted into the first subassembly.

In another feature, the plurality of passages surround the plurality of protrusions without contacting the plurality of protrusions, respectively.

In another feature, the plurality of passages and the plurality of protrusions extend radially from center regions of the first and second subassemblies, respectively.

In another feature, the second subassembly includes an inlet to receive a fluid that flows through the plurality of passages and an outlet to discharge the fluid from the plurality of passages.

In other features, each passage of the plurality of passages has a first width and a first depth. Each protrusion of the plurality of protrusions has a second width and a second height that are respectively less than the first width and the first depth.

In another feature, the plurality of passages and the plurality of protrusions have symmetrical shapes.

In another feature, the plurality of passages and the plurality of protrusions have asymmetrical shapes.

In another feature, the cooling assembly further comprises a plurality of seals that seal points of contact between the plurality of protrusions and the plurality of passages, respectively.

In other features, the first and second subassemblies are made of a first material. The cooling assembly further comprises an electrically conducting element that is made of a second material having a higher electron affinity than the first material and that is removably disposed in the second subassembly to be in fluid communication with the fluid.

In another feature, the first subassembly includes a tubular structure that extends vertically through a center of the first subassembly, that has a first end coupled to a first inlet to receive a process gas, and that has a second end to output the process gas to the showerhead.

In another feature, the second subassembly includes a manifold that surrounds the tubular structure, that is connected to a second inlet to receive a coolant, and that has outlets in fluid communication with the plurality of passages.

In another feature, the second subassembly includes an inlet to receive a purge gas and an outlet to output the purge gas to the showerhead.

In another feature, the cooling assembly further comprises a plurality of fasteners that fasten the second subassembly to the first subassembly.

In another feature, the cooling assembly further comprises a plurality of fasteners that extend through bores in the first and second subassemblies and that fasten the cooling assembly to the showerhead.

In still other features, a cooling assembly is coupled to a showerhead of a substrate processing system. The cooling assembly comprises a first subassembly and a second subassembly. The first sub assembly comprises a first annular flange, a first cylindrical wall, and a plurality of passages. The first cylindrical wall extend from the first annular flange to a first base portion enclosing a distal end of the first cylindrical wall. The first base portion is attached to the showerhead of the substrate processing system. The plurality of passages are arranged on a first side of the first base portion facing the first annular flange. The plurality of passages extend radially from a first center region of the first base portion towards an outer diameter of the first base portion. The second subassembly comprises a second annular flange coupled to the first annular flange, a second cylindrical wall, and a plurality of protrusions. The second cylindrical wall extends from the second annular flange to a second base portion. The second cylindrical wall encloses a distal end of the second cylindrical wall. The first cylindrical wall surrounds the second cylindrical wall. The plurality of protrusions are arranged on a second side of the second base portion facing away from the second annular flange. The plurality of protrusions extend radially from a second center region of the second base portion towards an outer diameter of the second base portion. The plurality of protrusions are aligned with the plurality of passages, respectively.

In other features, a system comprises the cooling assembly, the showerhead and a plurality of fasteners. The showerhead is coupled to a second side of the first base portion that is opposite to the first side of the first base portion. The plurality of fasteners traverse through the cooling assembly and fasten the showerhead to the second side of the first base portion.

In other features, a first passage of the plurality of passages has a first width and a first depth. A first protrusion of the plurality of protrusions has a second width that is less than the first width and has a second height that is less than the first depth.

In other features, the plurality of passages surround the plurality of protrusions, respectively.

In other features, the plurality of passages surround the plurality of protrusions without contacting the plurality of protrusions, respectively.

In other features, the first subassembly further comprises a tubular structure extending perpendicularly from the first center region of the first base portion towards the first annular flange. The second subassembly further comprises a first inlet to receive a coolant, a cylindrical manifold connected to the first inlet, and an outlet to discharge the coolant from the plurality of passages. The cylindrical manifold surrounds the tubular structure. The cylindrical manifold has outlets in fluid communication with the plurality of passages.

In other features, the first and second subassemblies are made of a first material. The cooling assembly further comprises an electrically conducting element that is made of a second material having a higher electron affinity than the first material and that is removably disposed in the second subassembly to be in fluid communication with the coolant.

In other features, the cooling assembly further comprises a plurality of fasteners fastening the second annular flange to the first annular flange.

In other features, the cooling assembly further comprises a plurality of seals that seal points of contact between the plurality of protrusions and the plurality of passages, respectively.

In another feature, the tubular structure is hollow and includes a first end coupled to a second inlet to receive a process gas and a second end to output the process gas to the showerhead.

In another feature, the second subassembly includes an inlet to receive a purge gas and an outlet to output the purge gas to the showerhead.

In other features, a system comprises the cooling assembly, the showerhead, and a coolant supply. The showerhead is coupled to a second side of the first base portion that is opposite to the first side of the first base portion. The coolant supply is configured to supply the coolant to the first inlet of the second subassembly.

In still other features, an assembly comprises a first subassembly and a second subassembly. The first subassembly comprises a first annular flange, a first cylindrical wall, and a plurality of passages. The first cylindrical wall extends from the first annular flange to a first base portion enclosing a distal end of the first cylindrical wall. The plurality of passages are arranged on a first side of the first base portion facing the first annular flange. The plurality of passages extend radially from a first center region of the first base portion towards an outer diameter of the first base portion. The second subassembly comprises a second annular flange coupled to the first annular flange, a second cylindrical wall, and a plurality of protrusions. The second cylindrical wall extends from the second annular flange to a second base portion. The second cylindrical wall encloses a distal end of the second cylindrical wall. The first cylindrical wall surrounds the second cylindrical wall. The plurality of protrusions are arranged on a second side of the second base portion facing away from the second annular flange. The plurality of protrusions extend radially from a second center region of the second base portion towards an outer diameter of the second base portion. The plurality of protrusions are aligned with the plurality of passages, respectively.

In other features, a first passage of the plurality of passages has a first width and a first depth. A first protrusion of the plurality of protrusions has a second width that is less than the first width and has a second height that is less than the first depth.

In other features, the plurality of passages surround the plurality of protrusions without contacting the plurality of protrusions, respectively.

In other features, the first subassembly further comprises a tubular structure extending perpendicularly from the first center region of the first base portion towards the first annular flange. The second subassembly further comprises an inlet to receive a fluid, a cylindrical manifold connected to the inlet, and an outlet to discharge the fluid from the plurality of passages. The cylindrical manifold surrounds the tubular structure.

The cylindrical manifold has outlets in fluid communication with the plurality of passages.

In other features, the first and second subassemblies are made of a first material. The assembly further comprises an electrically conducting element that is made of a second material having a higher electron affinity than the first material and that is removably disposed in the second subassembly to be in fluid communication with the fluid.

In other features, the assembly further comprises a plurality of fasteners fastening the second annular flange to the first annular flange.

In other features, the assembly further comprises a plurality of seals that seal points of contact between the plurality of protrusions and the plurality of passages, respectively.

In other features, a system comprises the assembly and an object coupled to a second side of the first base portion that is opposite to the first side of the first base portion. The system further comprises a plurality of fasteners that traverse through the assembly and that fasten the object to the second side of the first base portion. The system further comprises a fluid supply to supply the fluid to the inlet of the second subassembly. The fluid includes a coolant to cool the object or a hot fluid to heat the object.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
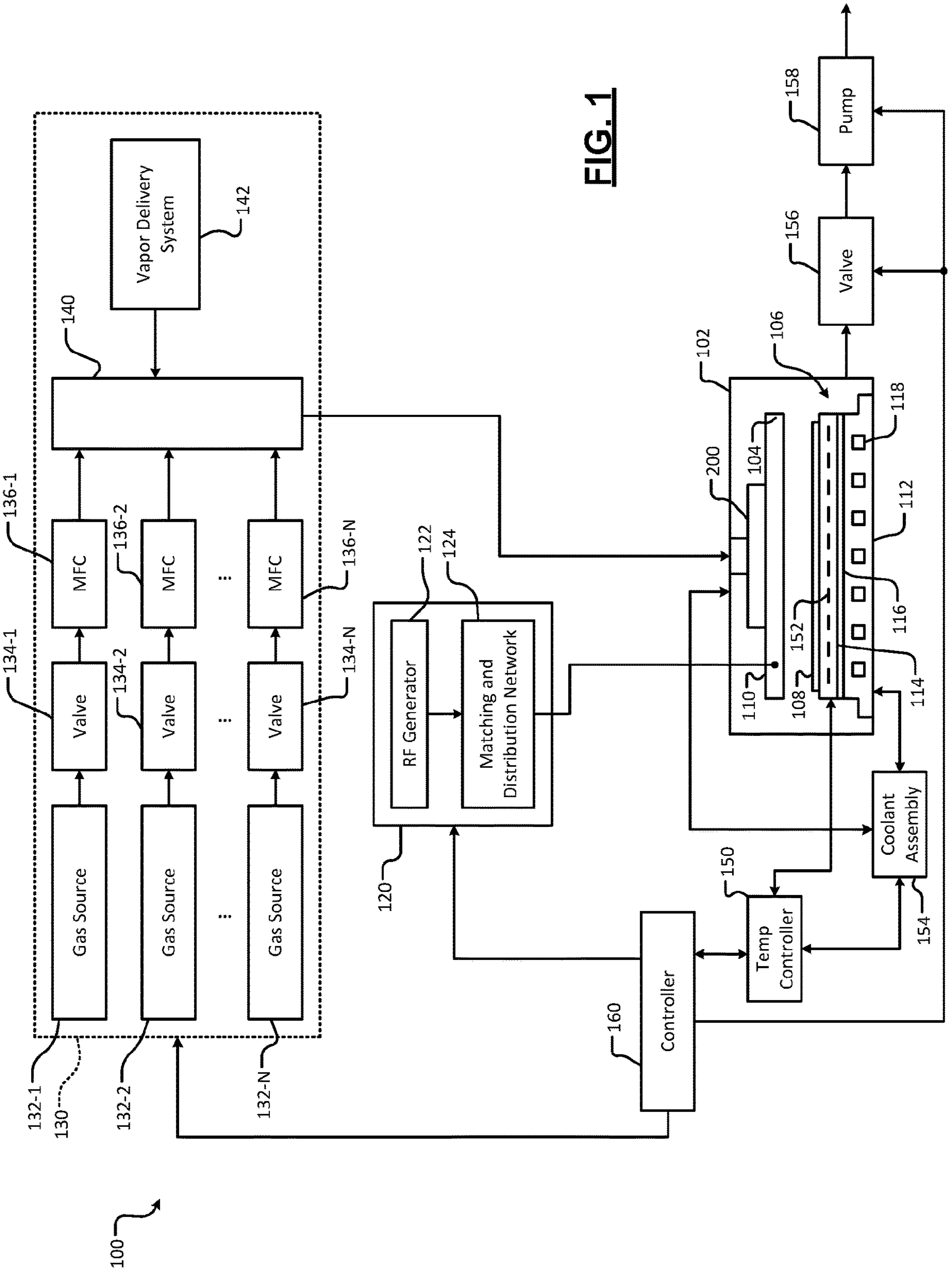
FIG. 1 shows an example of a substrate processing system including a processing chamber.

Showerheads often include heaters. Showerheads also include an electrode that is sometimes powered with RF power to generate plasma. As a result, the showerheads can become hot during substrate processing. Cooling plates are coupled to the showerheads to cool the showerheads. Currently, the cooling plates are constructed using vacuum brazing. Vacuum brazing is expensive, has a long lead time, and limits geometric design of the cooling plates. Further, due to their permanent construction, the cooling plates cannot be serviced and are discarded when fouled or corroded. Additionally, the cooling plates can sometimes contain residual debris from manufacturing, which can neither be verified nor removed when new showerheads are installed. The debris can damage substrates. Furthermore, components of these cooling plates have insufficient cooling efficiency.

The present disclosure provides a split cooling plate design that alleviates the above problems. The design utilizes seals and machined components to form a plurality of complex and high efficiency cooling paths in the split cooling plate that provide improved heat exchange between metal that surrounds the cooling paths and a coolant that flows through the cooling paths. The ability to disassemble the split cooling plate allows for its components to be cleaned when fouled. The design also allows for disassembling new cooling plates before installation and removing any residual debris from manufacturing. Additionally, the design incorporates a sacrificial anode to prevent pitting of the cooling plate from galvanic corrosion.

The split cooling plate (hereinafter called a cooling assembly) according to the present disclosure comprises two subassemblies that include male-female structures (i.e., projections on one subassembly and recesses or grooves in another subassembly) that mate together to form the cooling assembly when the two subassemblies are joined together. The cooling assembly includes paths or passages through which the coolant flows. The passages are arranged in a hub and spoke type design with the passages forming the spokes. The passages conduct heat from the showerhead, and the heat is transferred from the passages to the coolant by heat exchange between the metal edges defining the passages and the coolant flowing through the passages. The passages are narrow in width (measured laterally or circumferentially along the XY plane) and deep (measured vertically or along the Z axis). The narrow width of the passages allows rapid heat exchange between elements surrounding the passages and the coolant flowing through the passages to provide effective cooling. The depth of the passages allows the passages to carry a sufficient amount of coolant to provide effective cooling. Such narrow and deep passages are difficult to manufacture when the cooling assembly is manufactured as a single integrated unit. However, they are easier to manufacture when the cooling assembly is split into two subassemblies according to the present disclosure as described below in detail.

Initially, before describing the cooling assembly, an example of a substrate processing system is described with reference to FIG. 1, in which a processing chamber includes a showerhead. The cooling assembly according to the present disclosure can be used in this and any other substrate processing system in which a processing chamber includes a showerhead. The teachings of the present disclosure are not limited to cooling showerheads. Rather, any structure or device can be cooled using the cooling assembly. Further, the teachings of the present disclosure are not limited to providing cooling only. Rather, the teachings can be used to provide heating instead of cooling due to the efficient heat exchange mechanism provided by the split design of the cooling assembly. In heating applications, a hot fluid instead of a coolant is flowed through the assembly to heat the elements surrounding the passages.

FIG. 1 shows an example of a substrate processing system 100 comprising a processing chamber 102 configured to generate capacitively coupled plasma. The processing chamber 102 that encloses other components of the substrate processing system 100 and contains RF plasma (if used). The processing chamber 102 comprises an upper electrode 104 and an electrostatic chuck (ESC) 106 or other type of substrate support. During operation, a substrate 108 is arranged on the ESC 106.

For example, the upper electrode 104 may include a gas distribution device 110 such as a showerhead that introduces and distributes process gases. The gas distribution device 110 may include a stem portion including one end connected to a top surface of the processing chamber 102. A base portion of the showerhead is generally cylindrical and extends radially outwardly from an opposite end of the stem portion at a location that is spaced from the top surface of the processing chamber 102. A substrate-facing surface or faceplate of the base portion of the showerhead includes a plurality of holes through which vaporized precursor, process gas, cleaning gas or purge gas flows. Alternately, the upper electrode 104 may include a conducting plate, and the gases may be introduced in another manner.

The ESC 106 comprises a baseplate 112 that acts as a lower electrode. The baseplate 112 supports a heating plate 114, which may correspond to a ceramic multi-zone heating plate. A thermal resistance layer 116 may be arranged between the heating plate 114 and the baseplate 112. The baseplate 112 may include one or more channels 118 for flowing coolant through the baseplate 112.

If plasma is used, an RF generating system (or an RF source) 120 generates and outputs an RF voltage to one of the upper electrode 104 and the lower electrode (e.g., the baseplate 112 of the ESC 106). The other one of the upper electrode 104 and the baseplate 112 may be DC grounded, AC grounded, or floating. For example, the RF generating system 120 may include an RF generator 122 that generates RF power that is fed by a matching and distribution network 124 to the upper electrode 104 or the baseplate 112. In other examples, while not shown, the plasma may be generated inductively or remotely and then supplied to the processing chamber 102.

A gas delivery system 130 includes one or more gas sources 132-1, 132-2, . . . , and 132-N (collectively gas sources 132), where N is an integer greater than zero. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. A vapor delivery system 142 supplies vaporized precursor to the manifold 140 or another manifold (not shown) that is connected to the processing chamber 102. An output of the manifold 140 is fed to the processing chamber 102. The gas sources 132 may supply process gases, cleaning gases, and/or purge gases.

A temperature controller 150 may be connected to a plurality of thermal control elements (TCEs) 152 arranged in the heating plate 114. The temperature controller 150 may be used to control the plurality of TCEs 152 to control a temperature of the ESC 106 and the substrate 108. The temperature controller 150 may communicate with a coolant assembly 154 to control coolant flow through the channels 118. For example, the coolant assembly 154 may include a coolant pump, a reservoir, and one or more temperature sensors (not shown). The temperature controller 150 operates the coolant assembly 154 to selectively flow the coolant through the channels 118 to cool the ESC 106. A valve 156 and pump 158 may be used to evacuate reactants from the processing chamber 102. A system controller 160 controls the components of the substrate processing system 100.

A cooling assembly 200, which explained below in detail, is attached to the showerhead 110. The coolant assembly 154 supplies a coolant to the cooling assembly as described below in detail.

Figure 2A:
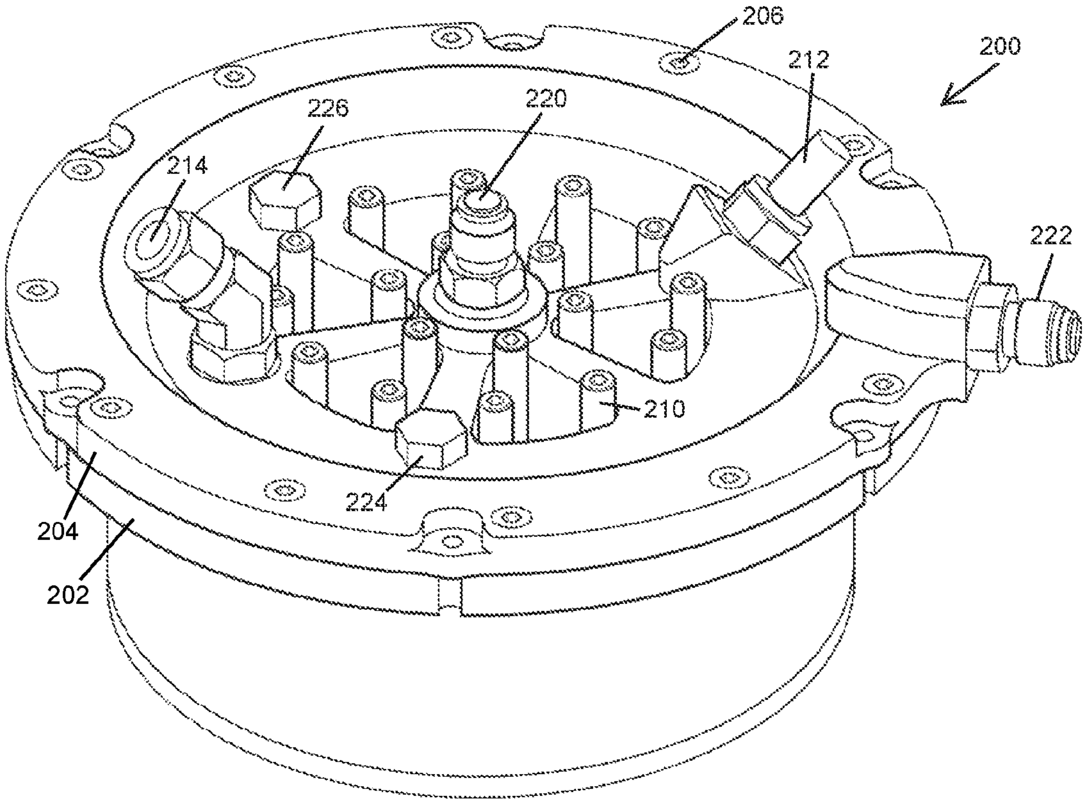
FIGS. 2A and 2B show an example of a cooling assembly for cooling a showerhead according to the present disclosure.
Figure 2B:
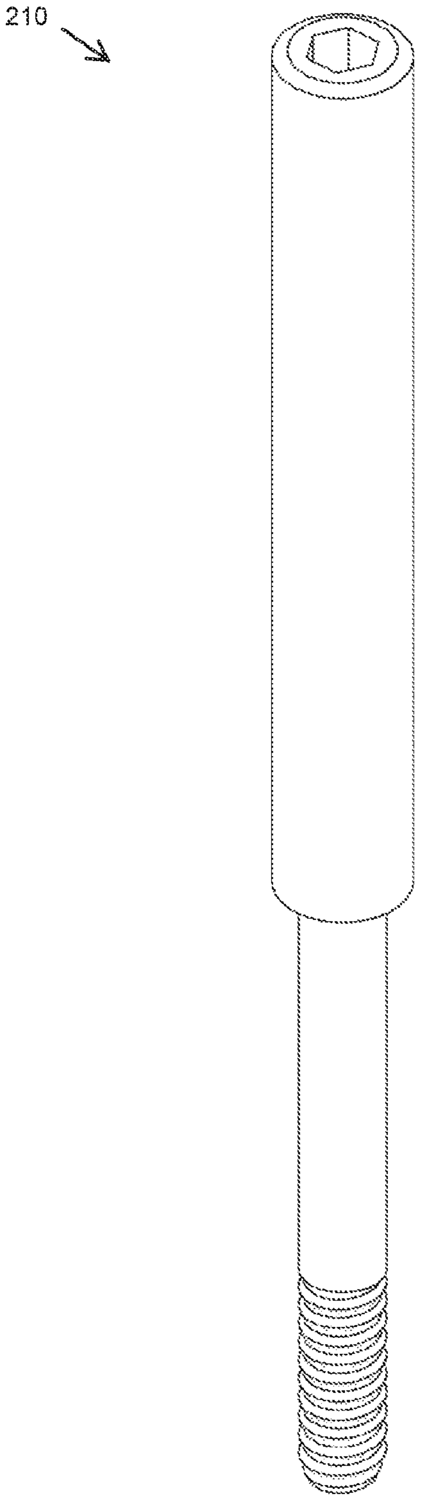

FIGS. 2A and 2B show a cooling assembly 200 according to the present disclosure. The cooling assembly comprises two subassemblies: a first subassembly 202 and a second subassembly 204. The two subassemblies 202 and 204 are shown and described with reference to FIGS. 3 and 4, respectively. In general, the first subassembly 202 is hollow and cylindrical in shape having an inner diameter. The second subassembly 204 is solid and cylindrical in shape having an outer diameter that is greater than the inner diameter of the first subassembly 202. Accordingly, the second subassembly 204 slides into (i.e., can be inserted into) the first subassembly 202. Fasteners 206 join the two subassemblies 202 and 204 to each other to form the cooling assembly 200. While the cooling assembly 200 is described as being cylindrical, it can be of any other shape, in which case, the components of the cooling assembly will be of commensurate shapes.

The cooling assembly 200 is attached to a showerhead (e.g., the showerhead 110 shown in FIG. 1) using fasteners 210 (see one of the fasteners 210 shown separately in FIG. 2B). The fasteners 210 can be inserted into bores that traverse through the cooling assembly 200 to the bottom portion of the cooling assembly 200. The fasteners 210 enter the cooling assembly 200 from the top of the cooling assembly 200 through the bores and attach the bottom portion of the cooling assembly 200 to a top portion of the showerhead. The passages and protrusions in the first and second subassemblies 202 and 204 are designed and arranged around these bores for the fasteners 210 and other elements of the cooling assembly 200 as described below.

The cooling assembly 200 includes an inlet 212 through which a coolant is supplied (e.g., from the coolant assembly 154 shown in FIG. 1) to flow into the cooling assembly 200. The cooling assembly 200 includes an outlet 214 through which the coolant exits the cooling assembly 200 after circulating through the passages in the cooling assembly 200 (shown in FIGS. 3 and 4) and removing heat from elements of the cooling assembly 200 surrounding the passages.

The cooling assembly 200 is made of a metal such as aluminum. The bottom portion of the cooling assembly 200 is in thermal contact with the top portion of the showerhead. Due to a thermal gradient between the cooling assembly 200 and the showerhead, the metal in the bottom portion of the cooling assembly 200 conducts heat from the top portion of the showerhead. The heat from the metal in the bottom portion of the cooling assembly 200 is conducted by the coolant circulating through the passages in the cooling assembly 200, which cools the showerhead.

The cooling assembly 200 includes inlets 220 and 222 for supplying process and purge gases (e.g., from the gas delivery system 130 shown in FIG. 1) to the showerhead through the cooling assembly 200, respectively. The cooling assembly 200 includes a temperature sensor 224 that can be used to sense the temperature of the cooling assembly 200 or of the coolant flowing through the cooling assembly 200. The controller 160 shown in FIG. 1 (or the temperature controller 150 shown in FIG. 1) shuts down the substrate processing system if the temperature of the cooling assembly 200 or of the coolant flowing through the cooling assembly 200 sensed by the temperature sensor 224 becomes greater than or equal to a threshold.

The cooling assembly 200 includes a sacrificial anode 226 that is in fluid communication with the coolant that flows through the cooling assembly 200. The sacrificial anode 226 is made of a material having a greater affinity for any reactants present in the coolant than the metal used to manufacture the cooling assembly 200. Instead of the metal used to manufacture the cooling assembly 200, the sacrificial anode 226 attracts any reactive ions present in the coolant. As a result, the sacrificial anode 226 corrodes instead of the metal used to manufacture the cooling assembly 200 due to exposure to and reaction with any reactants present in the coolant. The sacrificial anode 226 is easy and much cheaper to remove and replace than the cooling assembly 200. Thus, the sacrificial anode 226 not only extends the life of the cooling assembly 200 but also reduces maintenance that may be otherwise required to remove the buildup of corrosive material on the interior of the cooling assembly 200.

The sacrificial anode 226 is usually in the form of a threaded bolt or a threaded rod. For example, the sacrificial anode 226 may include a head and a stud. The stud may be entirely or partially threaded. For example, only an initial portion of the stud near the head is threaded to bolt into the second subassembly 204. The sacrificial anode 226 is much less expensive than the cooling assembly 200 and can be easily replaced upon corrosion.

In general, the sacrificial anode 226 can include any electrically conducting element (e.g., a metal, and alloy, etc.) of any size and shape. The electrically conducting element can be removably disposed in the second subassembly 204 such that it is in fluid communication with the coolant. The electrically conducting element has a higher electron affinity than the material of the cooling assembly 200.

Figure 3:
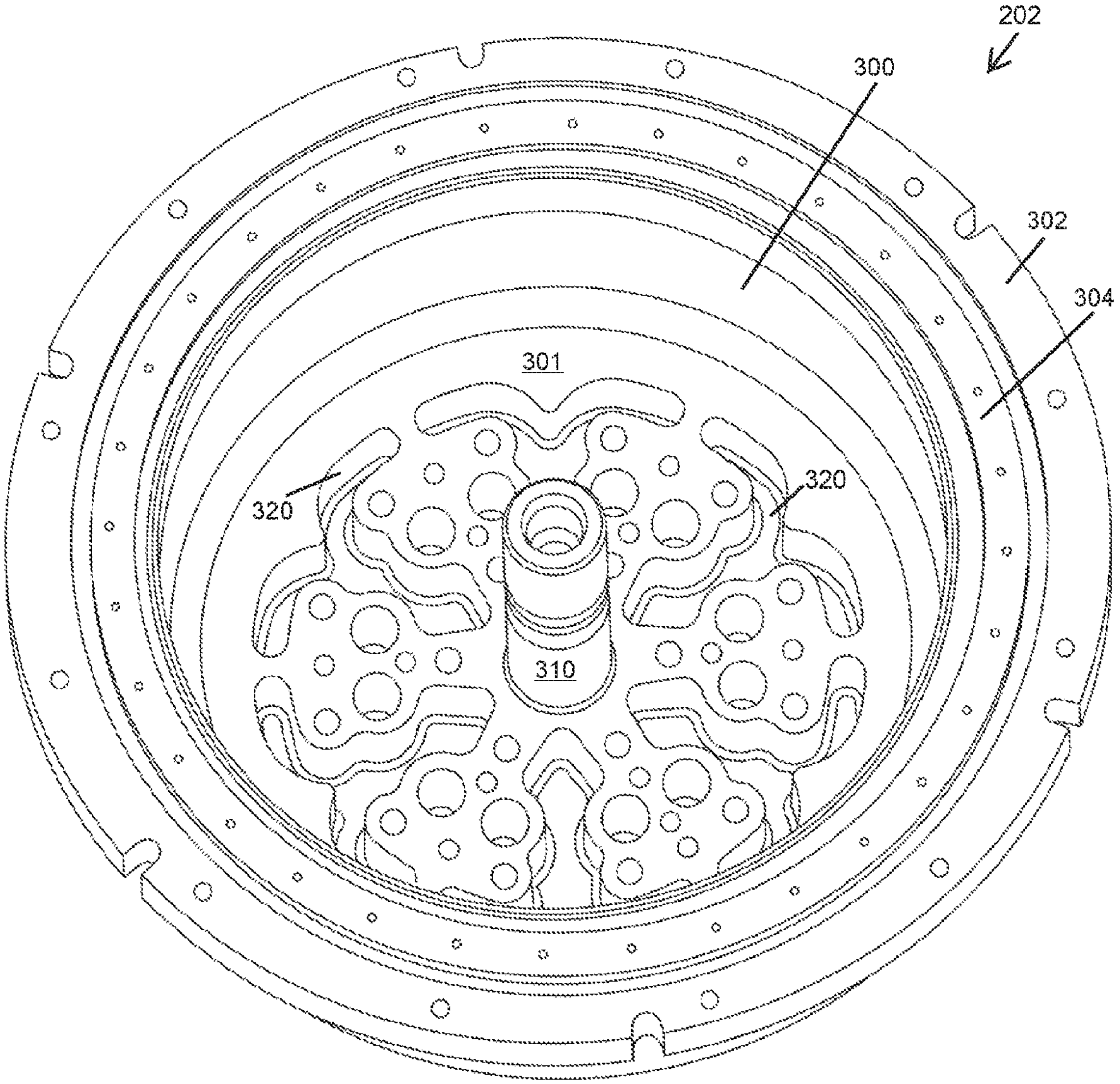
FIG. 3 shows an example of a first subassembly of the cooling assembly.

FIG. 3 shows the first subassembly 202 of the cooling assembly 200. The first subassembly 202 is the female portion of the cooling assembly 200 that mates with the male portion (i.e., the second subassembly 204) of the cooling assembly 200 shown and described with reference to FIG. 4.

The first subassembly 202 is a hollow cylindrical structure comprising a cylindrical wall 300 that descends (i.e., extends downwards) vertically from a flange 302 and joins a base portion 301 at the periphery or outer diameter of the base portion 301. An annular groove 304 is formed along an inner diameter of the flange 302 at the top end (i.e., the end opposite from the base portion 301) of the cylindrical wall 300. The flange 302 and the annular groove 304 receive corresponding elements of the second subassembly 204 (shown in FIG. 4), and the fasteners 206 (shown in FIG. 2) fasten the first and second subassemblies 202 and 204 together.

A tubular structure 310 extends vertically upwards from the base portion 301 of the first subassembly 202 and connects with the inlet 220 (shown in FIG. 2) supplying process gases to the showerhead arranged below the base portion 301. The tubular structure 310 is hollow. The base portion 301 of the first subassembly 202 includes an aperture at its center that coincides with a bottom portion of the tubular structure 310. The process gases from the inlet 220 flow through the tubular structure 310 and flow into the showerhead via the aperture.

On an inner side of the base portion 301 that is facing away from the showerhead, the base portion 301 comprises a plurality of passages through which the coolant flows. Only two passage are identified as 320. All passages are not labeled to not obscure other details shown. One of the passages or all of the passages are hereinafter called the passage 320 or the passages 320.

The passages 320 extend radially from a center region of the base portion 301 (i.e., from the periphery or outer diameter of the tubular structure 310) towards the periphery or the outer diameter of the base portion 301 where the base portion 301 joins the cylindrical wall 300. The tubular structure 310 and the passages 320 are thus arranged in a hub and spoke type arrangement. The passages 320 can originate at or near the outer diameter of the tubular structure 310 and can terminate at or near the outer diameter of the base portion 301.

The passages 320 are shown to have a distinctive shape that resembles the letter "T" for example only. The passages 320 need not have the distinctive shape. Rather, the shape of the passages 320 may be dictated by the application in which the cooling assembly 200 is used. For example, in the example shown, the shape of the passages 320 is dictated by the surrounding elements such as the bores for the fasteners 210, the tubular structure 310, etc. Accordingly, the passages 320 can be of any shape that is possible or practical depending on the elements that surround the passages 320.

For example, in some applications, the passages 320 may be linear, serpentine, zigzag, rectangular, or of any other shape. For example, in some applications, the passages 320 may be triangular in shape (like slices of a round pie or pizza), with the base of the triangle being proximate to the outer diameter of the base portion 301, and the apex of the triangle being proximate to the center region of the base portion 301. In some applications, the positions of the triangles may be reversed.

Further, all of the passages 320 need not be of the same shape. Again, depending on the sizes and shapes of the surrounding elements, the passages 320 can be of varying shapes. For example, some of the passages 320 can have regular shapes while some of the passages 320 may have irregular shapes. Furthermore, the passages 320 need not be arranged radially; instead, they can be arranged differently (e.g., circumferentially). Each passage 320 has a shape that matches the shape of the corresponding protrusion on the second subassembly 204 (shown in FIG. 4) with which the passage 320 mates.

The passages 320 have a width that is measured laterally or circumferentially along the XY plane. The width of the passages 320 is greater than the width of the protrusions on the second subassembly 204 (shown in FIG. 4) that mate with the passages 320. When the width of a passage 320 is non-uniform due to the shape of the passage 320 being irregular, the width of the passage 320 is greater than the width of the corresponding protrusion all along the passage 320.

Additionally, the passages 320 extend vertically or perpendicularly away from the flange 302 and towards a bottom of the first subassembly 202 (i.e., towards the showerhead) and have a depth that is measured vertically or along the Z axis. The depth of the passages 320 is greater than the height of the protrusions on the second subassembly 204 (shown in FIG. 4) that mate with the passages 320.

Accordingly, when the first and second subassemblies 202 and 204 are joined together by the fasteners 206, the distance from the metal edges of a passage 320 to the metal edges of a protrusion that mates with the passage 320 is relatively small. The small distance allows for rapid heat transfer from the metal edges of the passage 320 and the protrusion to the center of the coolant flowing through the passage 320. The rapid heat transfer from the metal to the coolant increases the efficiency with which the cooling assembly 200 cools the showerhead.

Conversely, in a heating application in which the cooling assembly 200 (which may be called a heating assembly 200 instead) is used to heat an object by flowing a heated fluid through the passages 320, the heat from the heating fluid flowing through the passages 320 is rapidly transferred to the metal portions surrounding the passages 320, which in turn efficiently heats the object coupled to the heating assembly 200.

Figure 4:
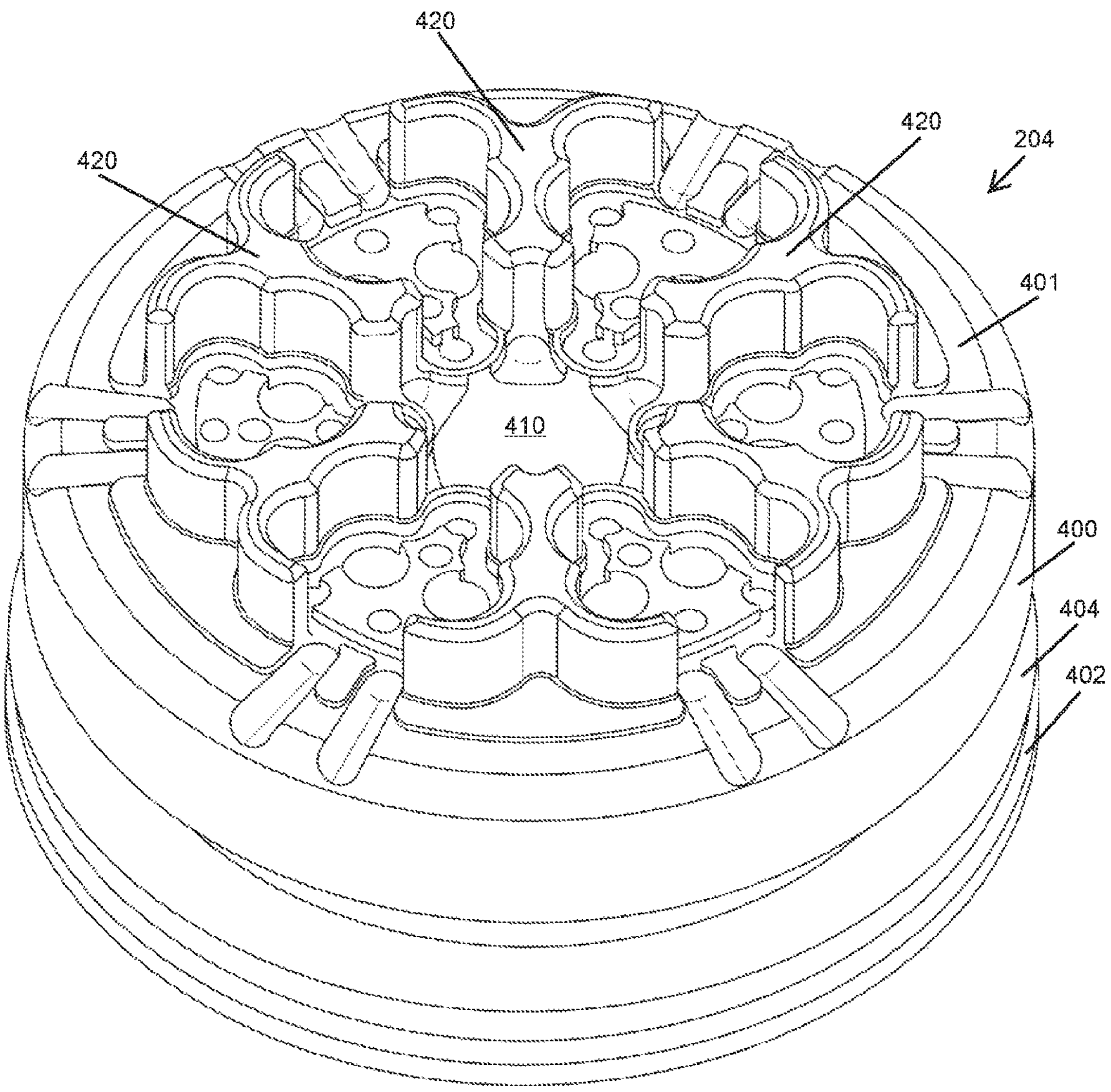
FIG. 4 shows an example of a second subassembly of the cooling assembly.

FIG. 4 shows the second subassembly 204 of the cooling assembly 200. The second subassembly 204 is the male portion of the cooling assembly 200 that mates with the female portion (i.e., the first subassembly 202) of the cooling assembly 200 shown and described with reference to FIG. 3.

The second subassembly 204 is shown upside down to illustrate its features. In the following description of the second subassembly 204, the terms referencing the directions up and down are used presuming that the second subassembly 204 is installed into (i.e., on top of) the first subassembly 202 shown in FIG. 3 so that the cooling assembly 200 is in the orientation shown in FIG. 2.

The second subassembly 204 is a solid cylindrical structure comprising a cylindrical wall 400 that descends (i.e., extends downwards) vertically from a flange 402 and joins a base portion 401 at the periphery or outer diameter of the base portion 401.

An annular groove 404 is formed along an inner diameter of the flange 402 at the top end (i.e., the end opposite from the base portion 401) of the cylindrical wall 400. The flange 402 and the annular groove 404 of the second subassembly 204 mate with the flange 302 and the annular groove 304 of the first subassembly 202 when the second subassembly 204 is installed into (i.e., on top of) the first subassembly 202, and the first and second subassemblies 202 and 204 are fastened together by the fasteners 206 (shown in FIG. 2). One or more O-rings (not shown) may be arranged in the flanges 302, 402 and/or the grooves 304, 404 to sealingly join the first and second subassemblies 202 and 204.

The second subassembly 204 includes a cylindrical cavity 410 at its center that extends through the length or height of the second subassembly 204. When the second subassembly 204 is installed into (i.e., on top of) the first subassembly 202, the tubular structure 310 of the first subassembly 202 extends through the cylindrical cavity 410 and connects with the inlet 220 (shown in FIG. 2).

On an outer side of the base portion 401 that faces the showerhead, the base portion 401 comprises a plurality of protrusions (i.e., male counterparts of the passages 320). Only few protrusions are identified as 420. All protrusions are not labeled to not obscure other details shown. One of the protrusions or all of the protrusions are hereinafter called the protrusion 420 or the protrusions 420.

The protrusions 420 extend radially from a center region of the base portion 401 (from the periphery or outer diameter of the cylindrical cavity 410) towards the periphery or the outer diameter of the base portion 401 where the base portion 401 joins the cylindrical wall 400. The cylindrical cavity 410 and the protrusions 420 are thus arranged in a hub and spoke type arrangement. The protrusions 420 can originate at or near the outer diameter of the cylindrical cavity 410 and can terminate at or near the outer diameter of the base portion 401.

The protrusions 420 are shown to have a distinctive shape that resembles the letter "T" for example only. The protrusions 420 need not have the distinctive shape.

Rather, the shape of the protrusions 420 may be dictated by the application in which the cooling assembly 200 is used. For example, in the example shown, the shape of the protrusions 420 is dictated by the surrounding elements such as the bores for the fasteners 210, the cylindrical cavity 410, etc. Accordingly, the protrusions 420 can be of any shape that is possible or practical depending on the elements that surround the protrusions 420.

For example, in some applications, the protrusions 420 may be linear, serpentine, zigzag, rectangular, or of any other shape. For example, in some applications, the protrusions 420 may be triangular in shape (like slices of a round pie or pizza), with the base of the triangle being proximate to the outer diameter of the base portion 401, and the apex of the triangle being proximate to the center region of the base portion 401. In some applications, the positions of the triangles may be reversed.

Further, all of the protrusions 420 need not be of the same shape. Again, depending on the sizes and shapes of the surrounding elements, the protrusions 420 can be of varying shapes. For example, some of the protrusions 420 can have regular shapes while some of the protrusions 420 may have irregular shapes. Furthermore, the protrusions 420 need not be arranged radially; instead, they can be arranged differently (e.g., circumferentially). Each protrusion 420 has a shape that matches the shape of the corresponding passage 320 with which the protrusion 420 mates.

The protrusions 420 have a width that is measured laterally or circumferentially along the XY plane. The width of the protrusions 420 is less than the width of the passages 320 in the first subassembly 202 (shown in FIG. 4) that mate with the protrusions 420. When the width of a protrusion 420 is non-uniform due to the shape of the protrusion 420 being irregular, the width of the protrusion 420 is less than the width of the corresponding passage 320 all along the protrusion 420.

Additionally, the protrusions 420 extend vertically or perpendicularly away from the flange 402 and outwards from a bottom of the second subassembly 204 (i.e., away from the base portion 401 towards the showerhead) and have a height that is measured vertically or along the Z axis. The height of the protrusions 420 is less than the depth of the passages 320 in the first subassembly 202 (shown in FIG. 4) that mate with the passages 320. According, when the first and second subassemblies 202 and 204 are joined together by the fasteners 206, a gap exists between the metal edges defining the passages 320 and the metal edges defining the protrusions 420.

Further, the distance from the metal edges of a passage 320 to the metal edges of a protrusion 420 that mates with the passage 320 is relatively small. The small distance allows for rapid heat transfer from the metal edges of the passage 320 and the metal edges of the protrusion 420 to the center of the coolant flowing through the passage 320. The rapid heat transfer from the metal to the coolant increases the efficiency with which the cooling assembly 200 cools the showerhead.

Figure 5:
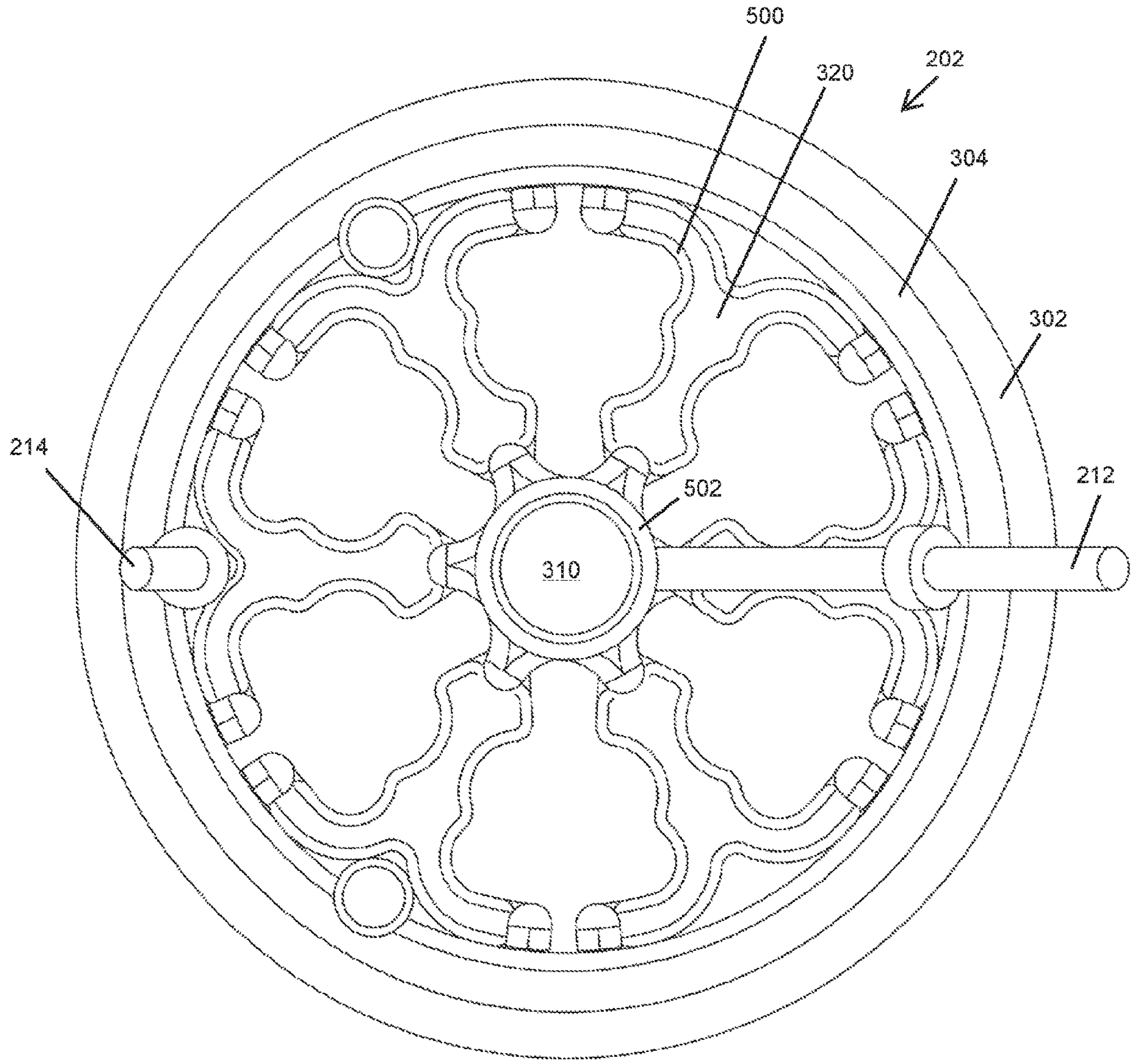
FIG. 5 shows an isometric view of the first subassembly.
Figure 6:
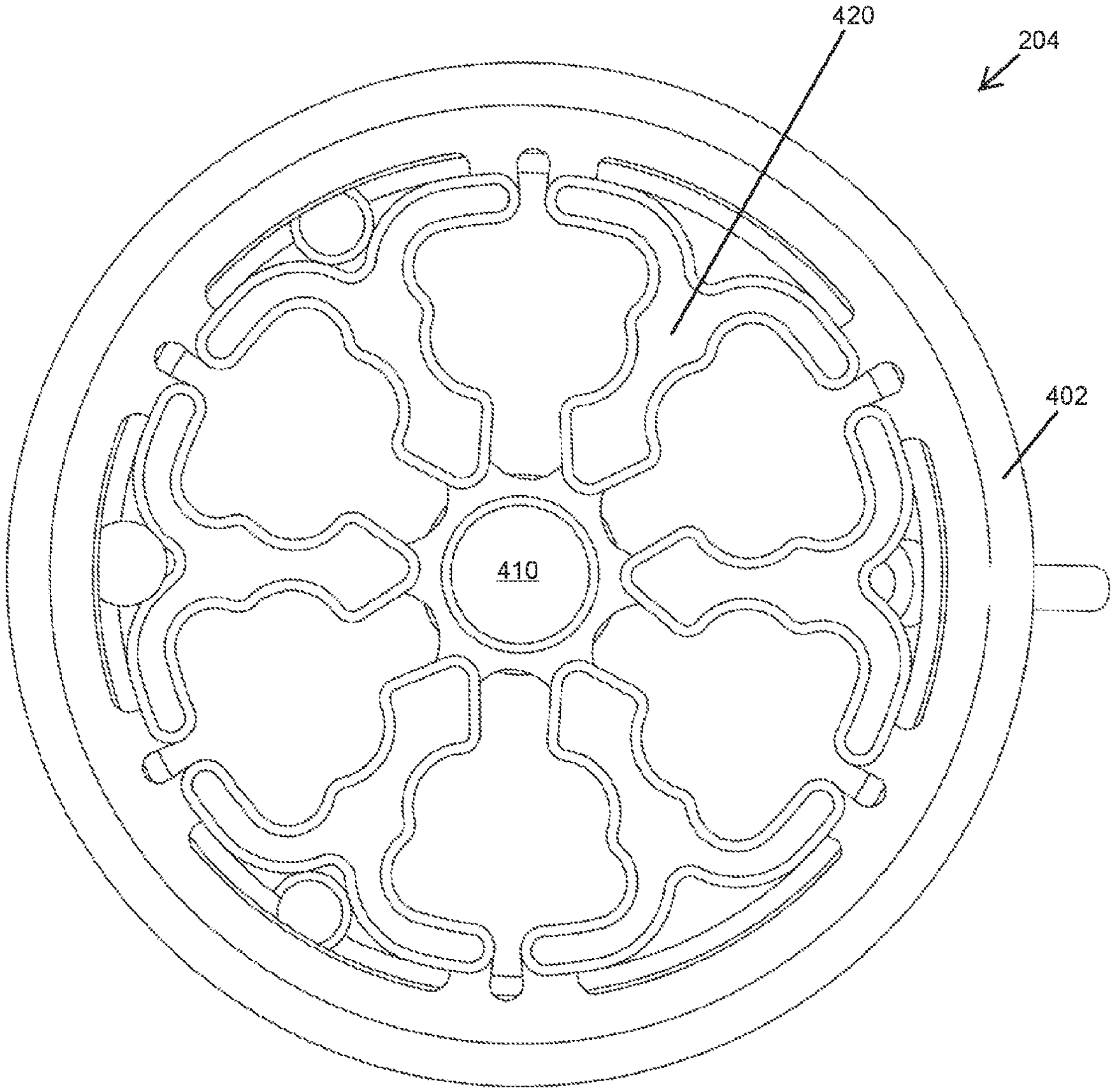
FIG. 6 shows an isometric view of the second subassembly.

FIG. 5 shows a plan view of the first subassembly 202 illustrating the passages 320. FIG. 6 shows a plan view of the second subassembly 204 illustrating the protrusions 420. In FIG. 5, a seal 500 is arranged on the metal edges of each of the passages 320. When the second subassembly 204 is installed on top of the first subassembly 202, the protrusions 420 mate with the passages 320, and the seals 500 seal prevent the coolant from leaking from the passages into the surrounding areas. The inlet 212 is connected to a manifold 502 that surround the tubular structure 410 and supplies the coolant to the manifold 502. The passages 320 are connected to the manifold 502 and receive the coolant from the manifold 502.

The number of the protrusion 420 in the second subassembly 204 is equal to the number of passages 320 in the first subassembly 202. The number of the passages 320 and the protrusions 420 in the cooling assembly can depend on the application. In general, the amount of cooling provided by the cooling assembly 200 is directly proportional to the number of passages 320 and the protrusions 420 in the cooling assembly 200.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another are within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A cooling assembly comprising:

a first subassembly coupled to a showerhead of a substrate processing system, the first subassembly comprising a plurality of passages proximate to and in thermal communication with the showerhead; and a second subassembly removably coupled to the first subassembly, the second subassembly comprising a plurality of protrusions that align with the plurality of passages, respectively.

2. The cooling assembly of claim 1 wherein:

the first subassembly is hollow and cylindrical in shape having an inner diameter;

the second subassembly is solid and cylindrical in shape having an outer diameter that is less than the inner diameter; and the second subassembly is inserted into the first subassembly.

3. The cooling assembly of claim 1, wherein the plurality of passages surround the plurality of protrusions without contacting the plurality of protrusions, respectively.

4. The cooling assembly of claim 1 wherein the plurality of passages and the plurality of protrusions extend radially from center regions of the first and second subassemblies, respectively.

5. The cooling assembly of claim 1 wherein the second subassembly comprises an inlet to receive a fluid that flows through the plurality of passages and an outlet to discharge the fluid from the plurality of passages.

6. The cooling assembly of claim 5 wherein the first and second subassemblies are made of a first material, the cooling assembly further comprising:

an electrically conducting element that is made of a second material having a higher electron affinity than the first material and that is removably disposed in the second subassembly to be in fluid communication with the fluid.

7. The cooling assembly of claim 1 wherein:

each passage of the plurality of passages has a first width and a first depth; and each protrusion of the plurality of protrusions has a second width and a second height that are respectively less than the first width and the first depth.

8. The cooling assembly of claim 1 wherein the plurality of passages and the plurality of protrusions have symmetrical shapes.

9. The cooling assembly of claim 1 wherein the plurality of passages and the plurality of protrusions have asymmetrical shapes.

10. The cooling assembly of claim 1 further comprising a plurality of seals that seal points of contact between the plurality of protrusions and the plurality of passages, respectively.

11. The cooling assembly of claim 1 wherein the first subassembly comprises a tubular structure that extends vertically through a center of the first subassembly, that has a first end coupled to a first inlet to receive a process gas, and that has a second end to output the process gas to the showerhead.

12. The cooling assembly of claim 11 wherein the second subassembly comprises a manifold that surrounds the tubular structure, that is connected to a second inlet to receive a coolant, and that has outlets in fluid communication with the plurality of passages.

13. The cooling assembly of claim 1 wherein the second subassembly comprises an inlet to receive a purge gas and an outlet to output the purge gas to the showerhead.

14. The cooling assembly of claim 1 further comprising a plurality of fasteners that fasten the second subassembly to the first subassembly.

15. The cooling assembly of claim 1 further comprising a plurality of fasteners that extend through bores in the first and second subassemblies and that fasten the cooling assembly to the showerhead.

16. A cooling assembly coupled to a showerhead of a substrate processing system, the cooling assembly comprising:

a first subassembly comprising:

a first annular flange;

a first cylindrical wall extending from the first annular flange to a first base portion enclosing a distal end of the first cylindrical wall, wherein the first base portion is attached to the showerhead of the substrate processing system; and a plurality of passages that are arranged on a first side of the first base portion facing the first annular flange and that extend radially from a first center region of the first base portion towards an outer diameter of the first base portion; and a second subassembly comprising:

a second annular flange coupled to the first annular flange;

a second cylindrical wall, that extends from the second annular flange to a second base portion and that encloses a distal end of the second cylindrical wall, wherein the first cylindrical wall surrounds the second cylindrical wall; and a plurality of protrusions that are arranged on a second side of the second base portion facing away from the second annular flange, that extend radially from a second center region of the second base portion towards an outer diameter of the second base portion, and that are aligned with the plurality of passages, respectively.

17. The cooling assembly of claim 16 wherein:

the first subassembly is made of a first material and further comprises a tubular structure extending perpendicularly from the first center region of the first base portion towards the first annular flange;

the second subassembly is made of the first material and further comprises:

a first inlet to receive a coolant;

a cylindrical manifold that surrounds the tubular structure, that is connected to the first inlet, and that has outlets in fluid communication with the plurality of passages; and an outlet to discharge the coolant from the plurality of passages; and wherein the cooling assembly further comprises an electrically conducting element that is made of a second material having a higher electron affinity than the first material and that is removably disposed in the second subassembly to be in fluid communication with the coolant.

18. An assembly comprising:

a first subassembly comprising:

a first annular flange;

a first cylindrical wall extending from the first annular flange to a first base portion enclosing a distal end of the first cylindrical wall; and a plurality of passages that are arranged on a first side of the first base portion facing the first annular flange and that extend radially from a first center region of the first base portion towards an outer diameter of the first base portion; and a second subassembly comprising:

a second annular flange coupled to the first annular flange;

a second cylindrical wall, that extends from the second annular flange to a second base portion and that encloses a distal end of the second cylindrical wall, wherein the first cylindrical wall surrounds the second cylindrical wall; and a plurality of protrusions that are arranged on a second side of the second base portion facing away from the second annular flange, that extend radially from a second center region of the second base portion towards an outer diameter of the second base portion, and that are aligned with the plurality of passages, respectively.

19. The assembly of claim 18 wherein:

the first subassembly further comprises a tubular structure extending perpendicularly from the first center region of the first base portion towards the first annular flange; and the second subassembly further comprises:

an inlet to receive a fluid;

a cylindrical manifold that surrounds the tubular structure, that is connected to the inlet, and that has outlets in fluid communication with the plurality of passages; and an outlet to discharge the fluid from the plurality of passages.

20. A system comprising:

the assembly of claim 19;

an object coupled to a second side of the first base portion that is opposite to the first side of the first base portion;

a plurality of fasteners that traverse through the assembly and that fasten the object to the second side of the first base portion; and a fluid supply to supply the fluid to the inlet of the second subassembly, wherein the fluid includes a coolant to cool the object or a hot fluid to heat the object.

* * * * *